(12) United States Patent
Pezeshki et al.

(10) Patent No.: US 11,515,356 B2
(45) Date of Patent: Nov. 29, 2022

(54) CHIP-SCALE OPTICAL INTERCONNECT USING MICROLEDS

(71) Applicants: Bardia Pezeshki, Sunnyvale, CA (US); Robert Kalman, Sunnyvale, CA (US)

(72) Inventors: Bardia Pezeshki, Sunnyvale, CA (US); Robert Kalman, Sunnyvale, CA (US)

(73) Assignee: AVICENATECH CORP., Mountain View, CA (US)

( * ) Notice: Subject to any disclaimer, the term of this patent is extended or adjusted under 35 U.S.C. 154(b) by 0 days.

(21) Appl. No.: 16/913,905

(22) Filed: Jun. 26, 2020

(65) Prior Publication Data

US 2020/0411587 A1    Dec. 31, 2020

Related U.S. Application Data

(60) Provisional application No. 62/900,383, filed on Sep. 13, 2019, provisional application No. 62/867,448, filed on Jun. 27, 2019.

(51) Int. Cl.
*G02B 6/43* (2006.01)
*G02B 6/42* (2006.01)
*H01L 27/15* (2006.01)

(52) U.S. Cl.
CPC .......... *H01L 27/156* (2013.01); *G02B 6/4214* (2013.01); *G02B 6/4257* (2013.01); *G02B 6/43* (2013.01)

(58) Field of Classification Search
CPC ....... H01L 27/156; G02B 6/4214; G02B 6/43; G02B 6/4257

USPC .......................................................... 385/14
See application file for complete search history.

(56) References Cited

U.S. PATENT DOCUMENTS

| | | | |
|---|---|---|---|
| 4,422,088 A * | 12/1983 | Gfeller | G02B 6/42 257/82 |
| 5,335,361 A | 8/1994 | Ghaem | |
| 5,638,469 A | 6/1997 | Feldman et al. | |
| 5,848,214 A | 12/1998 | Haas et al. | |
| 6,434,308 B1 | 8/2002 | Trezza | |
| 7,459,726 B2 | 12/2008 | Kato et al. | |
| 7,539,366 B1 | 5/2009 | Baks et al. | |
| 7,915,699 B2 | 3/2011 | Krishnamoorthy et al. | |
| 8,148,202 B2 | 4/2012 | Krishnamoorthy et al. | |
| 2002/0097962 A1* | 7/2002 | Yoshimura | H01L 23/48 385/50 |

(Continued)

FOREIGN PATENT DOCUMENTS

JP    2011-014932 A    1/2011

OTHER PUBLICATIONS

International Search Report on related PCT Application No. PCT/US2020/039968 from International Searching Authority (KIPO) dated Oct. 12, 2020.

(Continued)

*Primary Examiner* — Kaveh C Kianni
(74) *Attorney, Agent, or Firm* — Kos IP Law LLP

(57) ABSTRACT

In package intra-chip and/or inter-chip optical communications are provided using microLEDs and photodetectors mounted to integrated circuit (IC) chips and/or to transceiver dies associated with the IC chips. Light from the LEDs may pass through waveguides on or in a substrate to which the IC chips are mounted or which couple the IC chips.

2 Claims, 7 Drawing Sheets

(56) References Cited

U.S. PATENT DOCUMENTS

| | | | |
|---|---|---|---|
| 2004/0067006 A1* | 4/2004 | Welch | G01R 31/31728 385/14 |
| 2004/0126053 A1 | 7/2004 | Ouchi | |
| 2004/0159777 A1 | 8/2004 | Stone | |
| 2005/0169591 A1 | 8/2005 | Broeng et al. | |
| 2012/0251045 A1 | 10/2012 | Budd et al. | |
| 2013/0004119 A1* | 1/2013 | Yin | G02B 6/12004 385/14 |
| 2013/0230280 A1 | 9/2013 | Kadar-Kallen | |
| 2015/0333831 A1* | 11/2015 | Lai | G01J 1/0407 398/200 |
| 2015/0341119 A1 | 11/2015 | Fincato et al. | |
| 2016/0020353 A1* | 1/2016 | Chu | H01L 31/02327 257/21 |
| 2016/0172020 A1 | 6/2016 | Baker et al. | |
| 2016/0233269 A1 | 8/2016 | Choi et al. | |
| 2017/0018688 A1* | 1/2017 | Mazed | H01L 27/14627 |
| 2017/0184450 A1* | 6/2017 | Doylend | G01S 7/4817 |
| 2017/0276874 A1 | 9/2017 | Kashyap et al. | |
| 2018/0239096 A1 | 8/2018 | Houbertz et al. | |
| 2018/0269191 A1 | 9/2018 | England et al. | |
| 2019/0011652 A1 | 1/2019 | Chang | |
| 2019/0049367 A1 | 2/2019 | Zou | |
| 2019/0058242 A1* | 2/2019 | Tabe | H01Q 1/248 |
| 2019/0189603 A1 | 6/2019 | Wang et al. | |

OTHER PUBLICATIONS

Written Opinion on related PCT Application No. PCT/US2020/039968 from International Searching Authority (KIPO) dated Oct. 12, 2020.

J. F. C. Carreira et al., Direct integration of micro-LEDs and a SPAD detector on a silicon CMOS chip for data communications and time-of-flight ranging, Optics Express, vol. 28, No. 5, Mar. 2, 2020, pp. 6909-6917.

Martin D. Dawson, Micro-LEDs for Technological Convergence between Displays, Optical Communications, & Sensing and Imaging Systems, SID Display Week 2020, Session 44, Invited paper No. 44.1, 27 pages.

Lars Brusberg et al., Optoelectronic Glass Substrate for Co-packaged Optics and ASICs, Optical Fiber Communication Conference, Mar. 12, 2020, San Diego, CA, pp. 1-24.

Roger Dangel et al., Polymer Waveguides Enabling Scalable Low-Loss Adiabatic Optical Coupling for Silicon Photonics, IEEE Journal of Selected Topics In Quantum Electronics, vol. 24, No. 4, Jul./Aug. 2018, 11 pages.

Ziyang Zhang et al., Hybrid Photonic Integration on a Polymer Platform, Photonics 2015, 2, pp. 1005-1026.

David A. B. Miller, Optical Interconnects, IAA Workshop, Jul. 22, 2008, pp. 1-26.

Brian Corbett et al., Chapter Three—Transfer Printing for Silicon Photonics, Semiconductors and Semimetals, vol. 99, 2018, ISSN 0080-8784, pp. 43-70, https://doi.org/10.1016/bs.semsem.2018.08.001.

Bing Wang et al., On-chip Optical Interconnects using InGaN Light-Emitting Diodes Integrated with Si-CMOS, In: Aais Communications and Photonics Conference 2014, Shanghai, China, Nov. 11-14, 2014, pp. 1-3.

Lei Liu et al., On-chip optical interconnect on silicon by transfer printing, In: CLEO: Science and Innovations 2018, San Jose, California, USA, May 13-18, 2018, pp. 1-2.

Yurii Vlasov, Silicon photonics for next generation computing systems, Tutorial given at the European Conference on Optical Communications, Sep. 22, 2008.

Lee, et al., Low-Cost and Robust 1-Gbit/s Plastic Optical Fiber Link Based on Light-Emitting Diode Technology, Optical Society of America, 2008.

Yahav, et al., Multi-Gigabit Spatial-Division Multiplexing Transmission Over Multicore Plastic Optical Fiber, Journal of Lightwave Technology, vol. 39, No. 8, Apr. 15, 2021, pp. 2296-2304.

Extended European Search Report on EP20833220.5 from EPO dated Jul. 25, 2022.

* cited by examiner

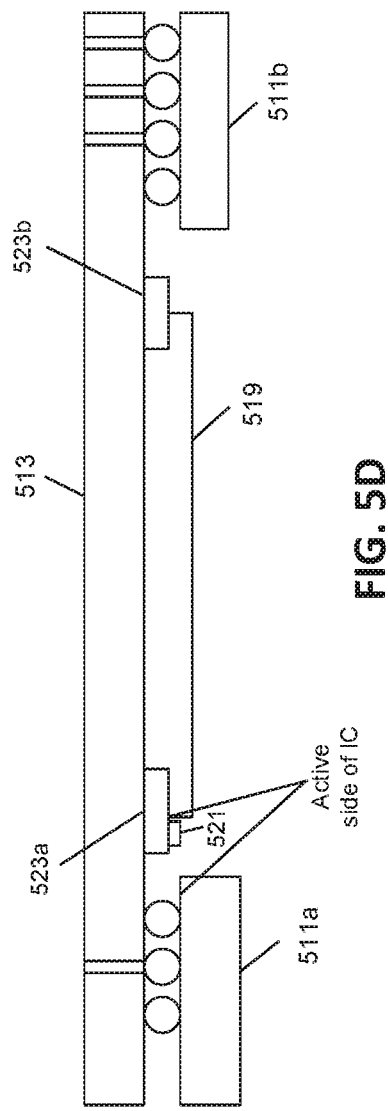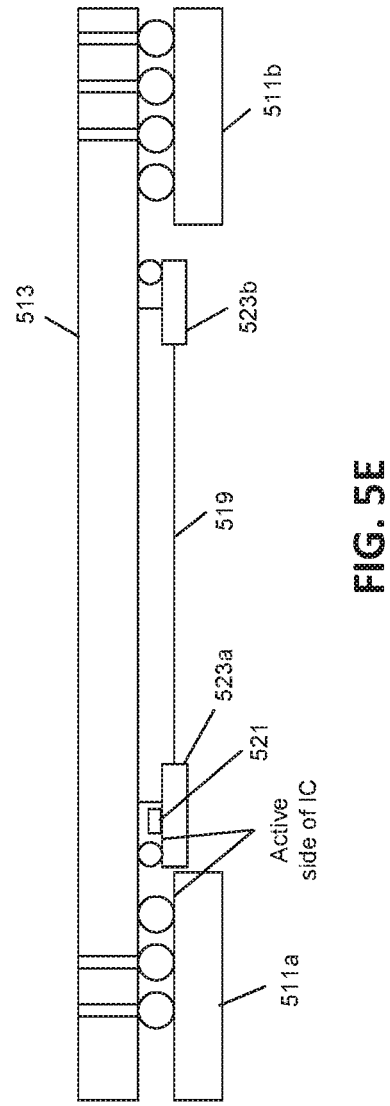

CHIP-SCALE OPTICAL INTERCONNECT USING MICROLEDS

CROSS REFERENCE TO RELATED APPLICATION

This application claims the benefit of the filing date of U.S. Provisional Patent Application No. 62/867,448, filed on Jun. 27, 2019, and U.S. Provisional Patent Application No. 62/900,383, filed on Sep. 13, 2019, the disclosures of which are incorporated by reference herein.

BACKGROUND OF THE INVENTION

The present application relates generally to high speed electronic packaging with short-distance connections use optical links.

Optical interconnects have replaced electrical connections over time. The low optical loss of the optical fiber, the intrinsically high bandwidth of light, the lack of interference, and the absence of parasitic inductance and capacitance, are all characteristics that favor the modulation of light for interconnects. Starting at long lengths, the advantages of optics has proven itself over shorter distance scales over time. Today, the highest speed links over a few meters are almost always optical. In the last decade, the growth of data centers and the massive deployment of optical components to connect switches and servers has generated substantial volume for optical components and resulted in dramatic innovations and investments in manufacturing infrastructure that have reduced the cost of optics, further enabling their deployment.

However, at lengths below a meter, interconnects remain electrical and are barriers for performance. Integrated circuits such as CPUs and GPUs are large, and sending data and clock signals across the silicon chip may be limited by the RC time constants of the interconnect metal. Getting information off the chip to co-packaged memory and connecting to peripherals all consume a great deal of power as electrical interconnects are lossy, distort the signal, and have capacitance that takes electrical power to charge up. Clock and data recovery circuits often must be used to periodically clean up the signal, which takes considerable electrical power. In a server, less than 5% of the electrical power consumption is for the actual computation in the gates, while greater than 95% is for transferring data across the IC, off the package and communicating with peripherals.

In addition to the RC and loss issues of electrical wiring, there is there also the limit that these interconnects are often confined to a 2D plane for example, on the surface of chips, ceramic packages, silicon interposers, or circuit boards.

The electrical interconnect issue at short distance scales has become a critical barrier as Moore's Law has slowed. Greater compute power is now obtained more through parallelism, which emphasizes communication between processor blocks. The increased importance of artificial intelligence circuits and graphical processing units are all limited by this communication barrier at shorter distances. Difficulty with clock synchronization on chip, limited memory bandwidth, and long latency to access data, are all choking high speed computation.

As an example, GPUs (graphical processing units) and microprocessors tend to access huge amounts memory at high speed. The amount of memory available and the latency in accessing data from memory is a serious limitation brought on by the limits of electrical interconnects. Lowest latency memory is on-board cache—incorporated directly into the same chip as the processor. But there is a limit to how much cache can be integrated. To access more memory, high bandwidth memory (HBM) is co-packaged with the processor using advanced packaging techniques, like using silicon interposers or silicon bridges. FIG. 1 shows a schematic of this co-packaging between processor and memory. FIG. 1 shows semiconductor package 111 with a graphics processor unit (GPU) chip 113 centrally located in the semiconductor package. HBM chips 115a-f are around the periphery of the GPU chip. To access even more memory, the processor may communicate through a slower bus (PCIe/CXL/or GenZ) to memory located further away. But this is of course at the price of higher latency and slower transfer rate.

HBM modules may be implemented in a memory stack 121 as stacks of DRAM, mounted on top of a controller chip connected to the GPU 113 by an electrical connection that passes through a silicon interposer 123 on which both sit. The stacks can be 8 layers high, and there may be 128 lanes connected to each die to form a bus that is 1024 lines wide. The transfer rate is 0.5 GT/s, moving to 2 GT/s or more in the future, to give a total transfer rate of 500 Gb/s to 2 Tb/s for each HBM. A GPU typically has 4 such HBM modules, giving a total transfer rate of up to 10 Tb/s and a total accessible memory of about 150 GB.

More DDR memory is of course available further away from the processor, typically with capacity of about 256 GB to 2 TB at a slower transfer rate of about 250 GB/s. Use of a PCIe bus can access even larger stores, but at a slower rate of about 64 GB/s per x16PCIe.

| Type of Memory | Distance | Capacity | Bandwidth/latency |
| --- | --- | --- | --- |
| On chip | 5 mm | 70 MB | Very high, a few clock cycles |
| In Package (HBM) | 20 mm | 16 GB-150 GB | 500 GB/s in stack - 3 TB/s for the system |
| DDR | 20 cm | 256 GB in Dimm-2 TB for the system | 30 GB-250 GB, 500 clock cycles latency |
| PCIe (CXL) | 25 cm | 1 TB | 64 GB/s per x16 PCIe |
| Intersystem (Rackscale) | 5 m | 10's TB | 64 GB/s per x16 PCIe |

Fundamentally the barriers for optics to penetrate these smaller links have been both at generating the light and transmitting it through an appropriate medium.

On the transmission side, lasers are generally unsuitable for use in large numbers for short distance interconnects. Edge emitting lasers are usually relatively large with a length of a few hundred microns. They are typically grown on III-V materials that are incompatible with silicon, with yields that are far below electronic devices in silicon. Semiconductor lasers have high temperature sensitivity, with power and reliability dropping rapidly at the temperatures normal for processor ICs. Lasers also have threshold currents of about a few milliamps, which wastes power. Vertical cavity lasers, rather than waveguide edge-emitting lasers, could be considered more appropriate as they are smaller and have lower threshold currents, but they are even more temperature sensitive. Using an external laser and on-chip modulators has been investigated, but waveguide modulators are lossy, consume a great deal of electrical power and are typically the same size as edge-emitting lasers. Vertical cavity modulators are temperature sensitive and difficult to use.

Recently silicon photonics and heterogenous integration of III-V materials with silicon has led to advances in optical transceivers and promises breakthroughs in bringing optical links to shorter distances. However, silicon photonics is also lossy and consumes the same amount of power as III-V components.

The medium is also an issue. Coupling optical fibers to silicon chips and the integration of lateral optical waveguides with copackaged lasers and electronics is complicated and expensive. Furthermore it does not break the 2D confinement of signals in plane. Using optics in free-space, on and off the chip is a possibility with VCSELs or vertical cavity modulators, but all the issues discussed with lasers would still apply.

BRIEF SUMMARY OF THE INVENTION

Aspects of some embodiments utilize advances in unrelated fields of optical devices for displays and waveguide structures for control of three-dimensional (3D) beams together, breaking the technological barriers in short distance data communications and providing for implementation of devices that can form data connections that are potentially fast, low power, and low cost, at short distances. This can help synchronize the clock signal on a chip, transfer data across a chip, connect ICs with memory, and connect to other peripherals.

In some embodiments optical communication is provided between two semiconductor chips using LEDs as a light source. In some embodiments the two semiconductor chips are within a same package, or coupled to a same package substrate. In some embodiments at least one of the semiconductor chips is configured to provide data signals to the LEDs, with the other of the semiconductor chips having detectors, either as part of the chip or coupled to the chip, to detect light from the LEDs. In some embodiments the LEDs and the detectors are optically coupled using waveguides. In some embodiments both of the semiconductor chips are configured to provide data signals to the LEDs and both of the semiconductor chips have detectors for detecting light from LEDs of the other chips. In various embodiments the LEDs are microLEDs.

Some embodiments provide a multi-chip module with inter-chip optical communications capability, comprising: a semiconductor package; a substrate within the semiconductor package; a first semiconductor chip including logic circuitry within the semiconductor package, the first semiconductor chip electrically coupled to the substrate; a second semiconductor chip including logic circuitry within the semiconductor package, the second semiconductor chip electrically coupled to the substrate; a first microLED coupled to the first semiconductor chip within the semiconductor package; circuitry within the semiconductor package for driving the first microLED based on signals of the logic circuitry of the first semiconductor chip; at least one waveguide; and a first photodetector within the semiconductor package optically coupled to the first microLED by the at least one waveguide, the first photodetector electrically coupled to the logic circuitry of the second semiconductor chip.

In some embodiments the first microLED is mounted to the first semiconductor chip. In some embodiments the first microLED is bonded to the first semiconductor chip. In some embodiments the first microLED is wafer bonded to the first semiconductor chip. In some embodiments the first photodetector is mounted to the second semiconductor chip. In some embodiments the first microLED is part of a transceiver separate from the first semiconductor chip. In some embodiments the first photodetector is part of a transceiver separate from the second semiconductor chip. In some embodiments the waveguide is on a surface of the substrate. In some embodiments the waveguide is within the substrate. In some embodiments the waveguide is on a surface of a further substrate. In some embodiments the waveguide is within a further substrate.

In some embodiments the substrate comprises an interposer. In some embodiments the first semiconductor chip comprises a processor and the second semiconductor chip comprises memory.

In some embodiments the microLED is on the order of 2 um×2 um or smaller. In some embodiments the at least one waveguide is in a planar lightwave circuit. In some embodiments the at least one waveguide includes mirrors or angle polished edges. In some embodiments the at least one waveguide is a three dimensional (3D) waveguide. In some embodiments the 3D waveguide is in glass. In some embodiments the at least one waveguide is a multimode waveguide.

In some embodiments the at least one waveguide is a single mode waveguide.

Some embodiments further comprise a second microLED coupled to the second semiconductor chip within the semiconductor package; circuitry within the semiconductor package for driving the second microLED based on signals of the logic circuitry of the second semiconductor chip; second photodetector within the semiconductor package optically coupled to the second microLED and electrically coupled to the logic circuitry of the first semiconductor chip.

In some such embodiments the second microLED is mounted to the second semiconductor chip. In some such embodiments the second photodetector is mounted to the first semiconductor chip. In some such embodiments the first microLED and the second photodetector are part of a first transceiver separate from the first semiconductor chip, and the second microLED and the first photodetector are part of a second transceiver separate from the second semiconductor chip. In some such embodiments the first microLED is bonded to the first semiconductor chip and the second microLED is bonded to the second semiconductor chip. In some such embodiments the first microLED and the second microLED are on the order of 2 μm×2 μm. Some embodiments further comprise a lens to couple light from the first microLED into the at least one waveguide.

Some embodiments provide an optical communications system for semiconductor chips on a common substrate, comprising: a plurality of first microLEDs associated with a first semiconductor chip, the first semiconductor chip electrically coupled to a substrate; a plurality of first photodetectors associated with a second semiconductor chip, the second semiconductor chip electrically coupled to the substrate; and a plurality of waveguides, each of the plurality of waveguides coupling different ones of the plurality of first microLEDs with different ones of the plurality of first photodetectors.

In some embodiments the plurality of waveguides comprise silicon dioxide waveguides. In some embodiments the silicon dioxide waveguides are in a glass substrate. Some embodiments further comprise etched mirrors in the glass substrate. In some embodiments at least some of the waveguides are joined by optical splitters. In some embodiments the first semiconductor chip comprises a processor and the second semiconductor chip comprises memory. In some embodiments the waveguides comprise 2 dimensional waveguides. In some embodiments the waveguides comprise 3 dimensional waveguides. Some embodiments further include a submount including at least some of the waveguides, the submount including an electrical interface for at least one of the first semiconductor chip and the second semiconductor chip.

Some embodiments provide an optical communication system for a semiconductor chip, comprising: an integrated circuit (IC) chip; at least one LED on the IC chip; at least one photodetector on the IC chip; and a substrate, the substrate having electrical couplings to the IC chip, the substrate having at least one waveguide for optically coupling the at least one LED and the at least one photodetector.

In some embodiments the at least one waveguide includes mirrors to redirect light received from the at least one LED and direct the light to the at least one photodetector. In some embodiments the IC chip comprises a processor. In some embodiments the substrate comprises a submount. In some embodiments the substrate comprises an interposer. In some embodiments the electrical couplings comprise solder microbumps. In some embodiments the substrate includes through chip vias.

These and other aspects of the invention are more fully comprehended upon review of this disclosure.

BRIEF DESCRIPTION OF THE FIGURES

FIGS. 5A-E illustrate integrated circuit chips coupled to a substrate, with LED based optical communications for communicating information between the integrated circuit chips.

DETAILED DESCRIPTION

Figure 1:
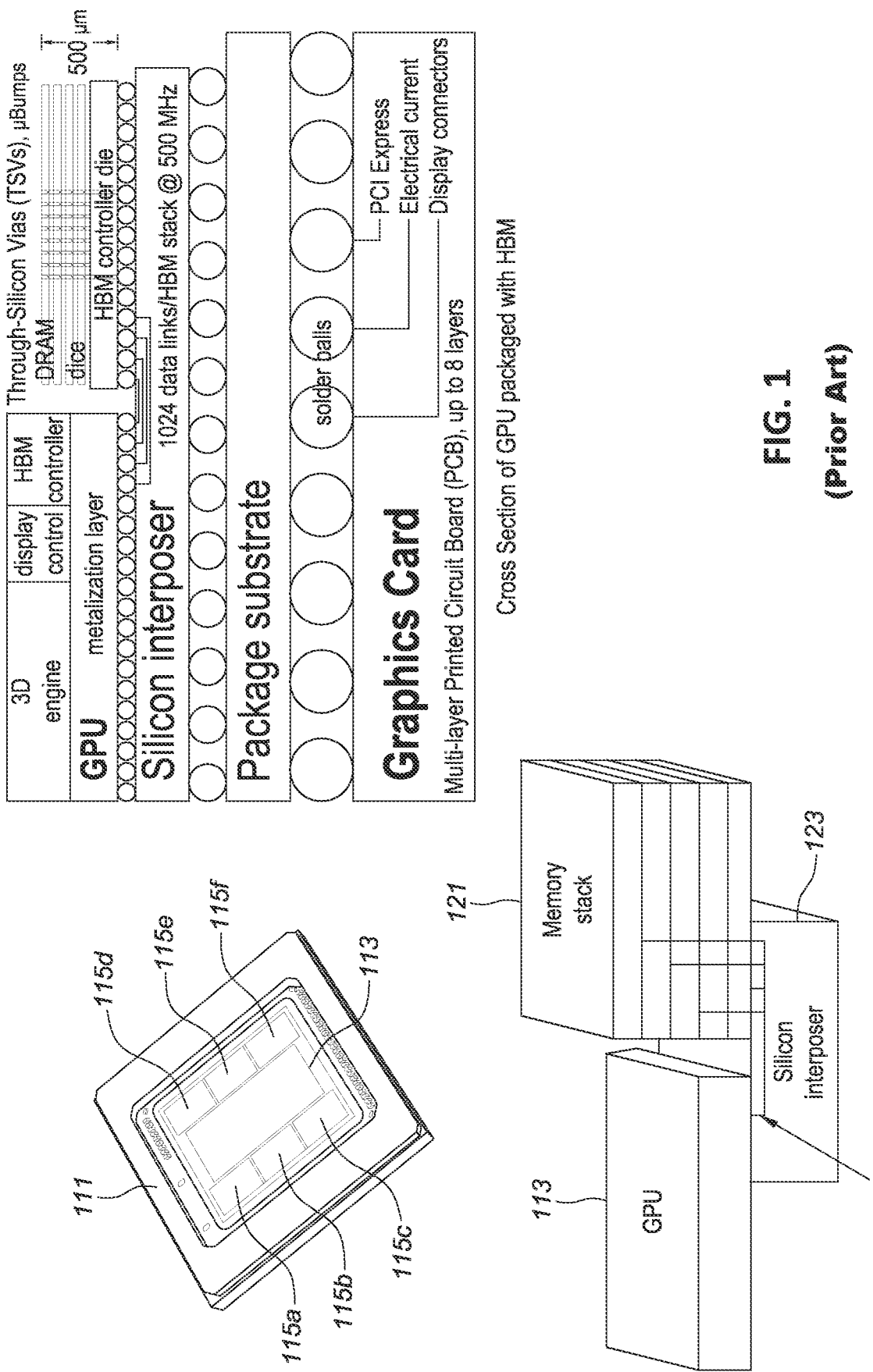
FIG. 1 shows how a processor chip is currently packaged with high bandwidth memory (HBM) (Prior Art).

Embodiments in accordance with this invention use LEDs, microLEDs in various embodiments, for inter-chip communication, with in some embodiments the chips in communication being within a common package or on a common package substrate. Some embodiments use an array of microLEDs, such as blue LEDs on the order of 2 um×2 um each. In some embodiments a microLED is distinguished from a semiconductor laser (SL) as follows: (1) a microLED does not have an optical resonator structure; (2) the optical output from a microLED is almost completely spontaneous emission, whereas the output from a SL is dominantly stimulated emission; (3) the optical output from a microLED is temporally and spatially incoherent, whereas the output from a SL has significant temporal and spatial coherence; (4) a microLED is designed to be driven down to a zero minimum current, whereas a SL is designed to be driven down to a minimum threshold current, which is typically at least 1 mA. In some embodiments a microLED is distinguished from a standard LED by (1) having an emitting region of less than 25 um×25 um in some embodiments, of less than 10 um×10 um in some embodiments, of less than 5 um×5 um in some embodiments; (2) frequently having positive and negative contacts on top and bottom surfaces, whereas a standard LED typically has both positive and negative contacts on a single surface; (3) typically being used in large arrays for display and interconnect applications. In some embodiments the microLEDs are bonded to chips, in some embodiments wafer bonded to chips. For example, in some embodiments the microLEDs are bonded to a GPU and to memory stacks. The blue light, generated by the microLEDs, carries data which is received by detectors, for example either GaN detectors or silicon photodetectors/phototransistors. Memory modules, with similar bonded microLEDs connect to the GPU through 3D waveguides.

Very high pixel per inch (PPI) microLEDs have been recently developed for various display applications, with sizes as small as 1 um reported in the literature. At this size, the LED has some properties that may be similar to a laser. The devices have high external quantum efficiencies matching those of lasers. Given that they are very small, they have small etendue—which means they can be coupled into small waveguides, very much like a laser. Though there is no stimulated emission, modulation speeds of a few GHz are possible, limited only by the RC time constant and carrier lifetime of the LED. Like carrier-induced waveguide modulators, faster response can be obtained by reversing the bias during the off-cycle. Faster response can also be obtained by driving the LED at high current density. Drive currents can be as low as 50 nA, with good external efficiency, and will realistically be limited by the bit error rate (BER) at the receiver at a given power.

Bonding technology to attach ~1 million microLEDs to silicon ICs has also been developed. Low capacitance can be obtained by an oxide-oxide bond with vias. A high temperature step expands the metals in the vias and fuses them together. Alignment between a source LED wafer and a target wafer (which is often a silicon wafer containing LED drive circuits) can be sub-micron using commercially available equipment.

Blue GaN microLEDs typically have an emission peak at about 430 nm, a wavelength where silicon is highly absorbing and very fast photodetectors with small absorption lengths can be realized. Even lower noise operation can be obtained using an avalanche photodiode (APD) structure.

Of course an LED does not have the coherence of a laser and emits light over a relatively wide optical spectrum. At long distances this can be a serious issue as any medium is dispersive and a broad spectral bandwidth will lead to a temporal spreading of the pulse with distance. However, this is not an issue as the application is typically about 1-5 Gb/s travelling a few centimeters. Numerically, the full width at half maximum (FWHM) of a blue microLED's optical spectrum centered at 430 nm might be about 20 nm, and the dispersion (dn/dλ) of fused silica about 0.08/um, so broadening would occur on a scale of many meters.

The remaining problem is the optical interconnect between the chips. The simplest implementation would be to use a silica-on-silicon planar lightwave circuit (PLC) with mirrors or even angle polished edges, which is a mature technology. In some embodiments, SiO2, SiN, or SiON waveguide arrays may be used. In some embodiments polymer waveguides may be used. SiO2, SiN, or SiON waveguide arrays can be fabricated on a rigid planar substrate such as silicon or glass. Polymer waveguides can be fabricated on one of the rigid planar substrates previously mentioned, or on a flexible substrate such as mylar, supporting flexible waveguide arrays that are not constrained to lie in a plane. These waveguide arrays are typically fabricated using planar semiconductor techniques like photolithography, planar deposition, etching, and diffusion. In some embodiments, light is guided between chips by waveguides in a PLC, with 45 degree mirrors or angle polished edged used to couple vertically emitted light into horizontal waveguides. One could incorporate simple optical devices such as splitters into the PLC chip. Multiple layers of waveguides can be formed on top of each other, with mirrors and vertical waveguiding. An even more powerful implementation is to use 3D waveguides which can be created in glass using a number of techniques. A common method is by focusing a high power laser into bulk glass to generate defects that act as higher index material or microlenses. Arbitrary 3D waveguides can be formed in this way. These defects act as waveguides to carry the energy from the transmitter to the receiver. Alternative methods, such as 3D printing, can also be used to make dense optical waveguides. Even without waveguides, microlenses and mirrors can deflect thousands of beams simultaneously.

These aspects are discussed through the use of the figures.

Figure 2:
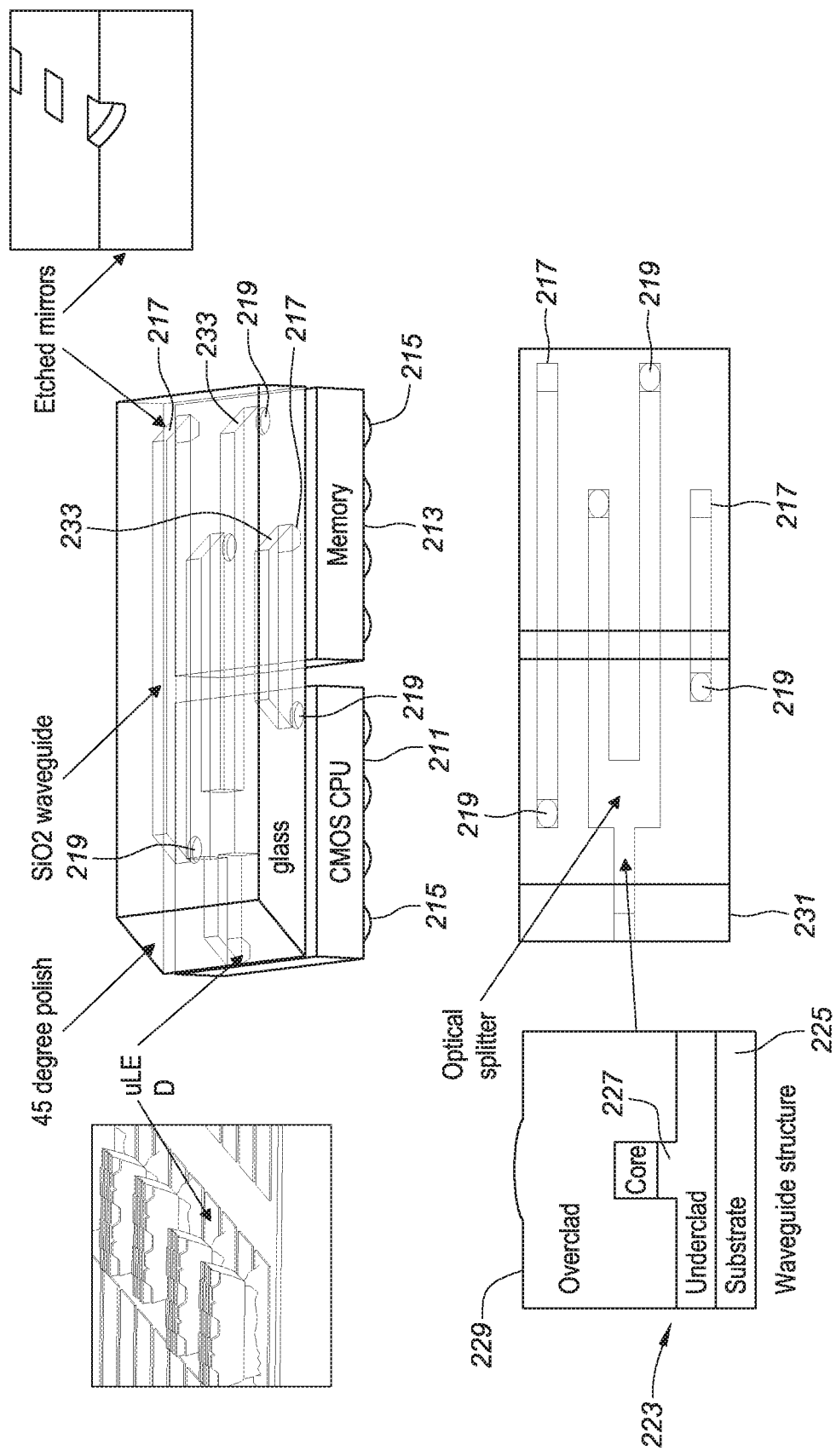
FIG. 2 shows electronic ICs having microLEDs and detectors interfaced with an optical waveguide chip.

FIG. 2 shows a simple implementation of an embodiment including aspects of the invention. In this case two chips are shown optically interconnected with optical waveguides. The leftmost chip is for example a CPU 211, and the rightmost chip is memory 213. The chips are electrically connected to a substrate or package from below using standard solder bumps or microbumps 215.

Both chips contain microLEDs 217 and photodetectors 219. Though only a few microLEDs are shown, a typical application would have many tens of thousands of microLEDs, or even millions. The microLEDs are separately grown on a suitable "source" substrate 221 like sapphire, GaN, or silicon and then lifted off of the source substrate and bonded onto the "target" substrate or chip. Commercial equipment exists for this process, and in fact a photograph of a microLED on silicon is shown to the left. This technology was developed mostly for microLED displays where the silicon chip is a backplane to address the microLEDs. Typically solder is used for the bonding the microLEDs to the target substrate or chip, and there are often subsequent processing steps such as planarization and metallization to electrically connect the microLEDs to the CMOS silicon chip. The microLEDs would have a typical dimension of 2 microns×2 microns.

The silicon chip would also have photodetectors fabricated on its surface. These can easily be made in silicon using a p-i-n or APD architecture. At wavelengths near 430 nm, silicon is highly absorbing, with an absorption coefficient of ~5×10^4/cm, and thus 1 micron of absorption length is sufficient to give very high quantum efficiency. Alternatively, detectors can be made in GaN or other materials and bonded to the silicon in the same way as the microLEDs.

A waveguide structure 223 is aligned and attached to the assembly. The simplest implementation of this waveguide wafer is using well-established silica-on-silicon technology, with layers deposited by PECVD or FHD. These waveguides are generally formed on a silicon wafer by first growing a layer of thermal oxide 225, about 10 or 20 (or 2 to 5) microns thick, then depositing a higher index germanium-doped core 227, typically 4 (or 2) microns. Then this core is patterned laterally using photolithography, then a top cladding 229 is formed of silica. In the figure, the silicon substrate is not shown and the waveguide dimensions are greatly exaggerated. In addition to silica-on-silicon, other materials can be used, such as silicon oxynitride waveguides, polymer waveguides, or other dielectrics. The waveguide structures can be simple connections, or can contain splitters or possess other functionality. The waveguides can be single mode or multimode in the transverse directions. Given that the interconnect distance is very short, modal dispersion from a multimode waveguide will not limit the useful data rate of the optical signal in many cases.

To couple light in and out of these waveguides various methods can be used. The simplest may be polishing the endface of the waveguide wafer at about 45 degrees. In this case light is reflected by the angled edge 231 into the waveguide. This is shown on the leftmost side of the figure. Alternatively, 45 degree mirrors 233 can be etched into the waveguide. These are shown schematically in the figure and a photograph of actual mirrors etched into silicon is shown to the right of the main figure. Note that there are multiple designs for this mirror. The core can be angled 45 degrees, or the light can exit the waveguide at a normal facet, then hit a second facet at 45 degrees. Light can also enter the waveguide using a grating. Instead of a mirror, a waveguide that is oriented normal to the bottom of the chip and then turns 90 degrees can also be used.

The light is then coupled from the microLED into the waveguide, traverses across the chip(s) and is reflected downwards onto a photodetector. The connection can be across a single chip, or it can be across many chips.

The small 2 um×2 um LEDs can be run at various current densities, depending on the optical loss between the LED and photodetector, the receiver sensitivity, and the required LED modulation speed. Current densities in the range of 5 A/cm^2 to 10000 A/cm^2 are typically useful, corresponding to drive currents of 200 nA to 400 µA.

Figure 3:
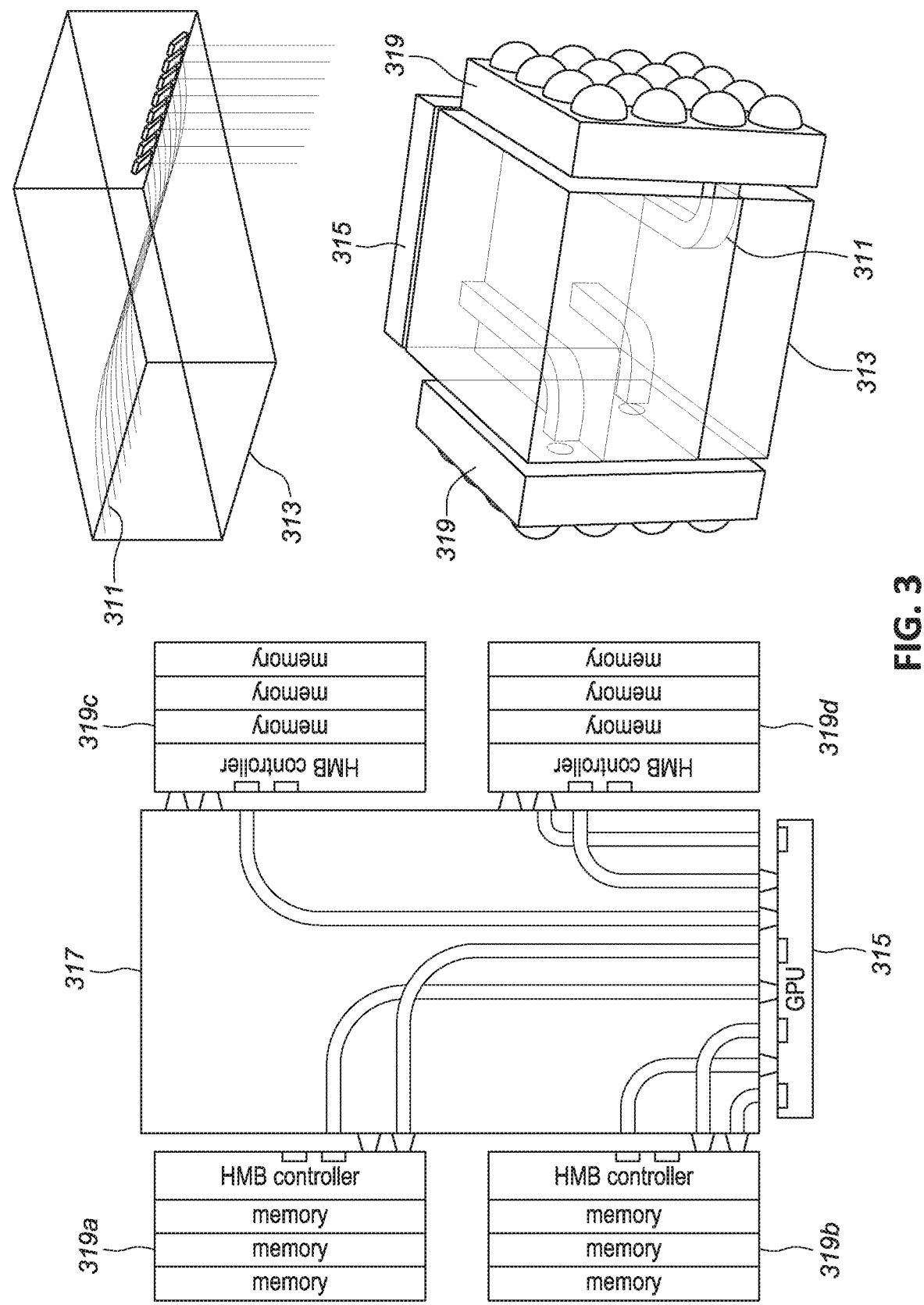
FIG. 3 shows how three-dimensional waveguide chips can connect multiple ICs on different facets.

The waveguide structure shown in FIG. 2 is a 2D waveguide where the light is largely confined to the plane. However, waveguide structures can be realized that contain more than a single plane of waveguides. Waveguides can be formed on top of each other to make multiple planes. Perhaps more interestingly, there have been recent developments at fabricating 3D waveguide structures. An example is shown in FIG. 3, where multiple waveguides 311 shift their vertical orientation through a piece of glass 313. They can be fabricated with 3D printing, where layers are formed on top of each other. Alternatively, a high power beam is focused in the glass and pulsed, permanently altering the material's optical properties at the location where the beam waist is smallest. Multiple altered areas are connected, forming waveguides. These structures can then be used to connect to ICs at different facets of the glass. The top right image is a commercial product schematic of 3D waveguides formed in glass for connecting to a fiber array. The two lower figures show how these 3D waveguides can connect multiple ICs. For example, on the left image of FIG. 3, a GPU 315 is at one end of a block of glass 317, while memory 319a-d is connected to other facets, and 3D waveguides 321 connect the different chips. In some embodiments a GPU may include a up to 1 million optical inputs and outputs, with hundreds of memory chips optically connected to the GPU, each with tens of thousands of optical connections.

Figure 4:
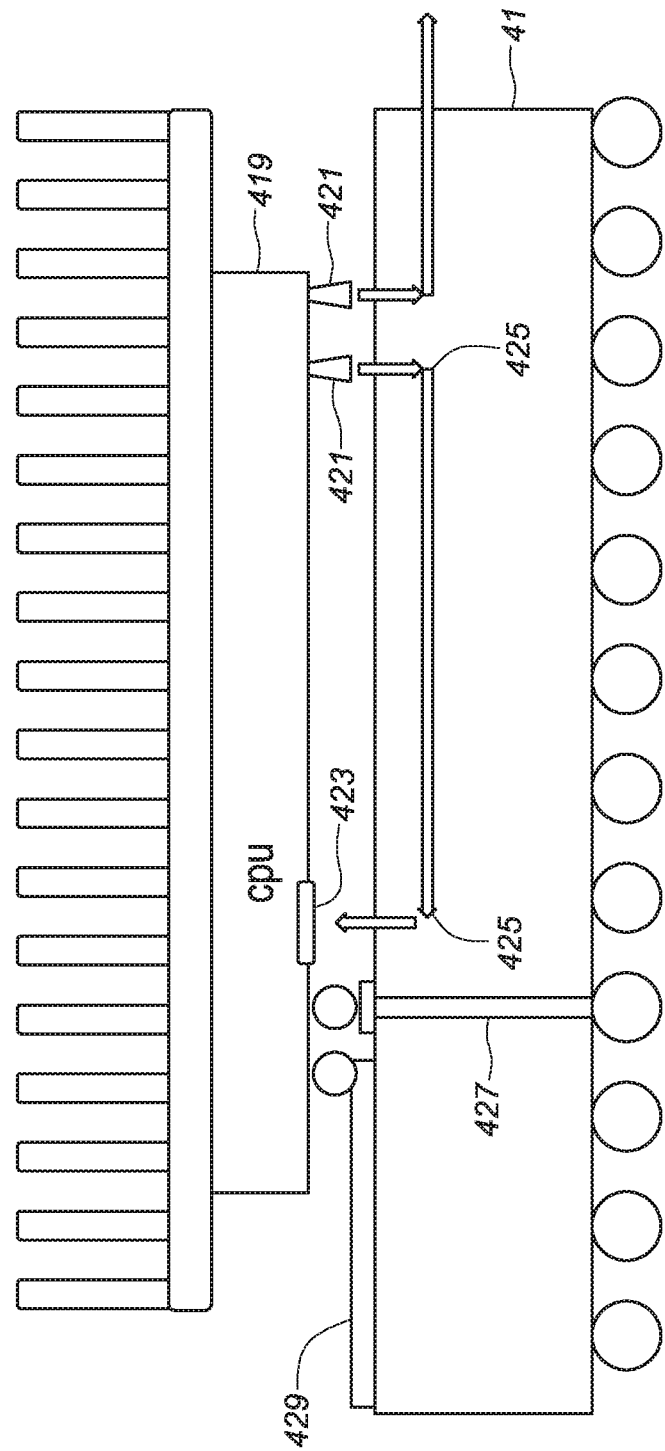
FIG. 4 shows how the waveguide chip can also have metallization and vias to provide electrical connection to the silicon processor chip.

By attaching an optical waveguide layer to the IC, we have potentially removed a surface that can be used for cooling. FIG. 4 illustrates an embodiment in which the optical waveguide chip 411 can also provide an electrical interface, leaving another surface 415 of the chip for cooling. In this way the optical waveguide chip becomes an interposer or a submount. The CPU/GPU chip 419 is now upside down with LEDs 421 and photodetectors 423 facing down. The optical waveguide layer has mirrors 425 that receive the light from the LEDs and direct them horizontally and back up again to a detector, as previously explained. However, this time, the chip is deep reactive ion etched (DRIE) to form through-chip vias 427 that can electrically connect to the CPU with standard solder bumps or microbumps. Even without vias, electrical signals 429 can be directed to the periphery of the chip and connected that way. It is simple to add metallization to the optical waveguide chip and add solder bumps or microbumps. The other side of the chip can now easily be cooled in a standard geometry. The waveguide can also connect to the other ICs.

FIGS. 5A-E illustrate integrated circuit (IC) chips coupled to a substrate, with LED-based optical communications for communicating information between the integrated circuit chips. In most embodiments the LEDs are microLEDs. For convenience, only a single LED is shown in each of FIGS. 5A-E, in most embodiments a plurality of LEDs are present. In all of FIGS. 5A-E, a first IC chip 511a and a second IC chip 511b are both mounted to a substrate 513, on the same side of the substrate in FIGS. 5A-E. In some embodiments the substrate may be part of an integrated circuit package. In some embodiments the substrate may be an interposer. In some embodiments the substrate may be a bridge, with for example only part of each of the first IC chip and only part of the second IC chip mounted to the bridge. In some embodiments the first IC chip and the second IC chip are part of a multi-chip module. The IC chips are shown as having electrical connections via solder bumps or microbumps 515 to vias of the substrate. FIGS. 5A-E show the vias as through substrate vias (TSVs) 517, although in various embodiments the vias may lead to redistribution layers (RDLs) or other signal routing means in the substrates, and in some embodiments the substrate may not provide for electrical connections for the IC chips. An optical waveguide 519 is on the substrate, on the same side as the first IC chip and second IC chip. In some embodiments the optical waveguide is within the substrate, and in some embodiments the optical waveguide is on an opposing side of the substrate from the first IC chip and the second IC chip.

Figure 5A:
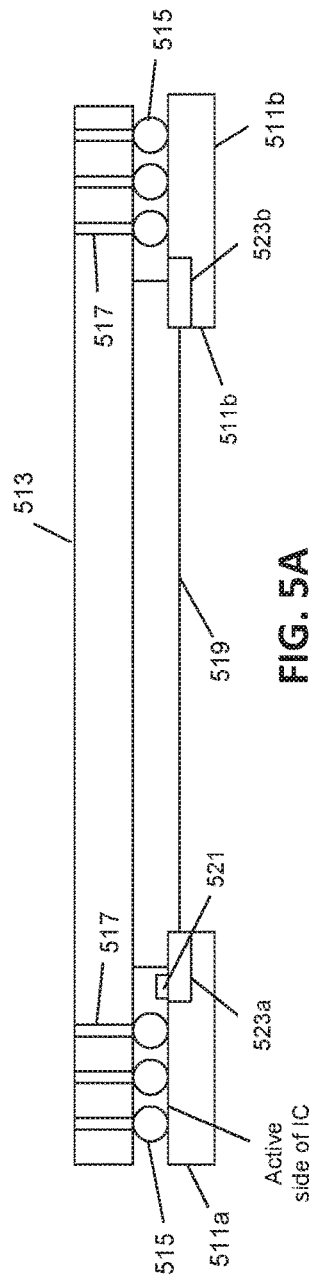

In FIG. 5A, an LED 521 is on the first IC chip 511a. Light from the LED propagates through the optical waveguide 519 to a photodetector (not shown) on the second IC chip 511b. In some embodiments, and as illustrated in FIG. 5a, the LED has a height less than that of the solder bumps and/or microbumps, and is in a space between the first IC chip and substrate, with a height of the space determined by dimensions and/or properties of the solder bumps/microbumps. Driver circuitry for operating the LED, imposing data signals on light emitted by the LED, is part of the first IC chip. Receive circuitry for processing signals generated by the photodetector are part of the second IC chip. In many embodiments the photodetector is part of the receive circuitry. In some embodiments the photodetector is a discrete device mounted to the second IC chip, with the photodetector electrically coupled to the receive circuitry. In many embodiments, the optical waveguide also passes light from an LED (not shown) on the second IC chip, to a photodetector (not shown) on the first IC chip, with driver circuitry for the LED of the second chip part of the second IC chip and receive circuitry associated with the photodetector part of the first IC chip. As the combination of driver circuitry and receive circuitry may be commonly referred to as transceiver circuitry, for convenience FIGS. 5A-E simply show transceiver circuitry 523a,b. For FIG. 5A, the first IC chip includes the transceiver circuitry 523a and the second IC chip includes the transceiver circuitry 523b. The LED is shown as being on the part of the first IC chip having the transceiver circuitry 523a, although in some embodiments the LED may be differently positioned.

Figure 5B:
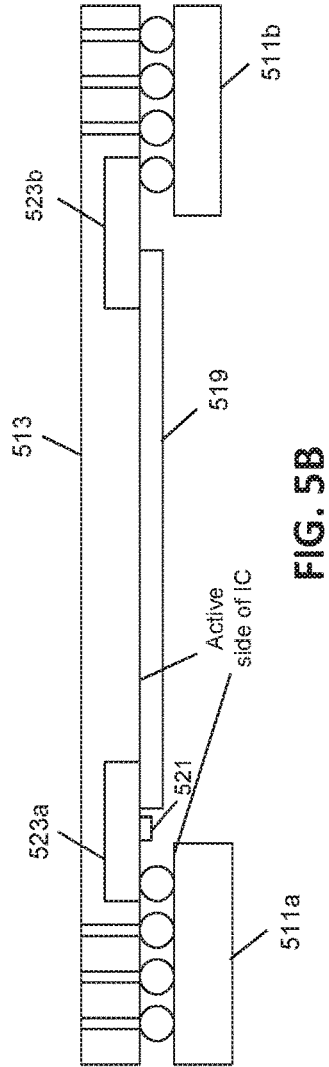

For FIGS. 5B-E, the LED is not shown as being on the first IC chip. In FIG. 5B, the LED 521 is instead on the substrate 513, and the transceiver circuitry 523a (and 523b) is within the substrate. In FIG. 5B, the transceiver circuitry is shown as being within the substrate, and about a side of the substrate facing, and partially overlapping, the first IC chip. In various embodiments, however, the transceiver circuitry may be otherwise positioned within the substrate. The transceiver circuitry may be electrically coupled to the first IC chip by way of the electrical connections of the substrate and/or solder bumps/microbumps. The LED 521 is shown in FIG. 5B as being on the side of the substrate facing the first IC chip, at the location of the transceiver circuitry 523a. In some embodiments, however, the LED may be differently positioned. The transceiver circuitry 523b is correspondingly positioned and electrically coupled with respect to the substrate and the second IC chip.

Figure 5C:
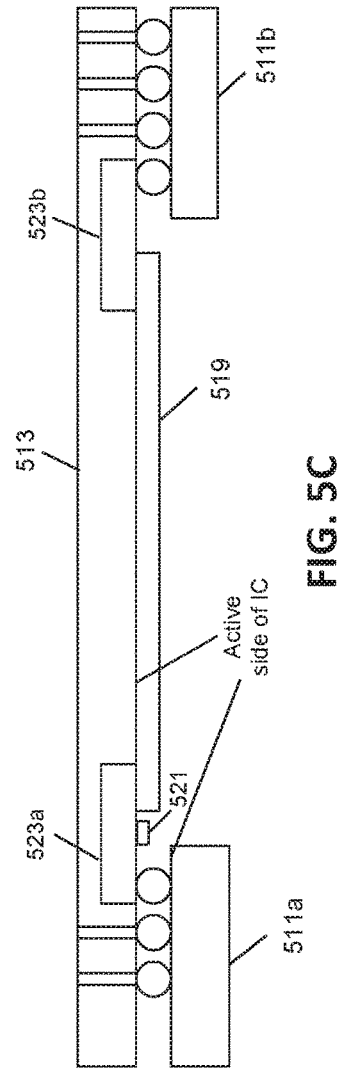

The embodiment of FIG. 5C differs from that of FIG. 5B in that the transceiver circuitry 523a,b is in a semiconductor die mounted in a cavity of the substrate. The LED may be mounted to the substrate, or, as illustrated in FIG. 5C, mounted to the transceiver semiconductor die.

In the embodiment of FIG. 5D, the transceiver semiconductor die is mounted to the substrate, with the LED on the transceiver semiconductor die. In FIG. 5E, the transceiver semiconductor die is coupled to the substrate by one or more solder bumps or microbumps, with the LED on the transceiver die between the die and the substrate.

Figure 6:
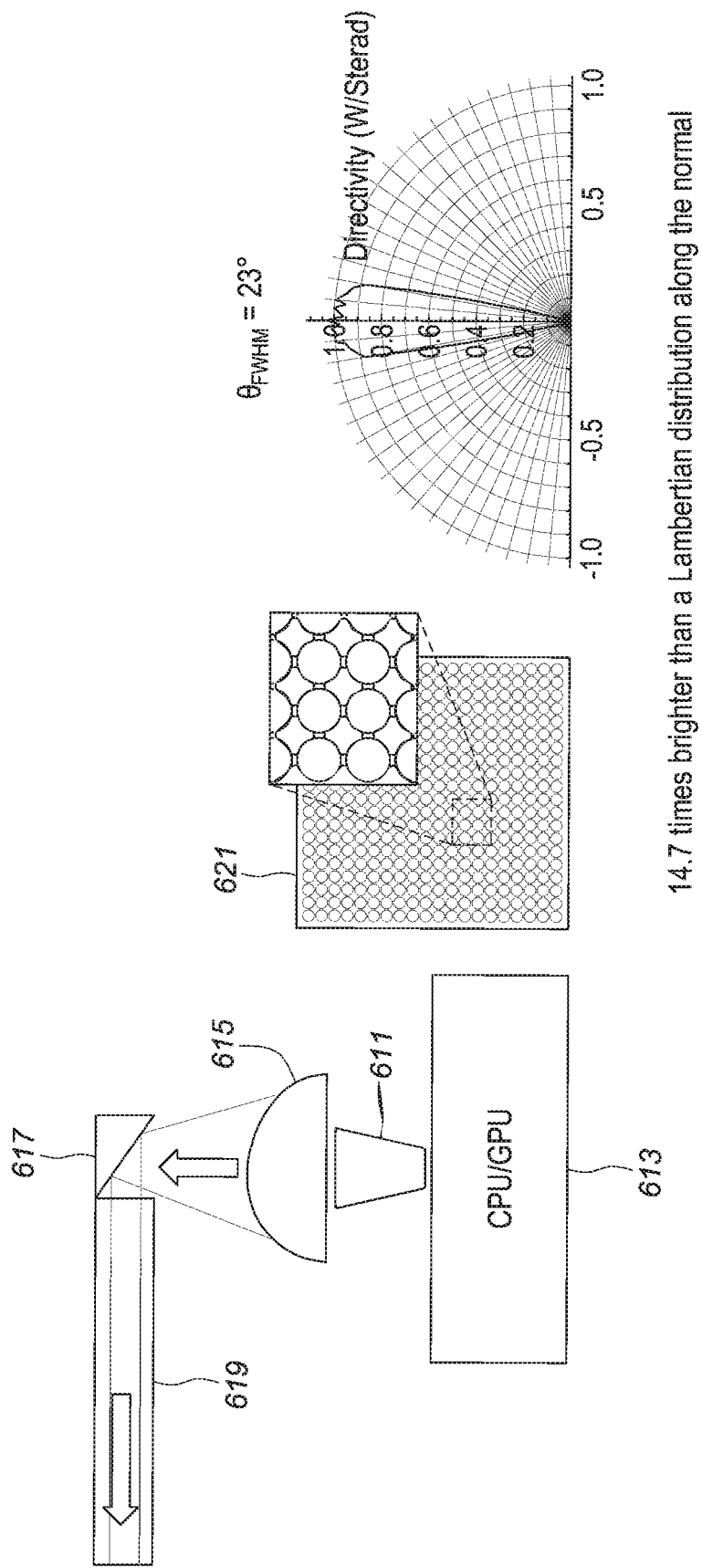
FIG. 6 shows how a microlens can increase the brightness of the beam and improve coupling to the optical waveguide.

Unlike a laser that emits light generally in the forward direction, the emission pattern from an LED is typically Lambertian. Addition of an optic, such as microlens, can tremendously improve the beam coupling to the waveguide. FIG. 6 shows an implementation of this approach, together with some simulation results of far-field angles with and without a microlens. In FIG. 6, a microLED 611 is on a CPU/GPU 613. A microlens 615 focuses at least some light emitted by the microLED onto a turning mirror 617. The turning mirror redirects the light by ninety degrees into an optical waveguide 619. The microlens may be part of a microlens assembly 621. In some embodiments the microlens assembly may include 1.5 um lenses at a 3.6 um pitch. With a FWHM of 23 degrees, as indicated by simulation, this is closely mode-matched to single mode fiber and can provide efficient coupling. In some embodiments, however, the lens is significantly larger than the LED, for example the lens may have a diameter at least two times a dimension of the LED in some embodiments, and at least eight times the dimension of the LED in other embodiments.

Blue microLEDs may be considered to require a relatively large drive voltage compared to CMOS electronics, and suitable circuits may be formed in the VLSI to forward bias the LEDs. For faster response, a reverse bias voltage may be used to sweep the carriers out of the quantum wells in the LED. In some embodiments a higher voltage line is provided into and/or in the CMOS IC for the driver. Alternatively, GaN is an excellent electronic material, and a driver can be monolithically integrated with the LED. On the receive side, a detector made from Si or GaN detector can have very high bandwidth and can have very high quantum efficiency when used with a GaN LED emitting at a short wavelength. So various embodiments would have a very good receiver signal to noise ratio without requiring special receive circuitry.

Although the invention has been discussed with respect to various embodiments, it should be recognized that the invention comprises the novel and non-obvious claims supported by this disclosure.

What is claimed is:

1. An optical communications system for semiconductor chips on a common substrate, comprising:
   a plurality of first microLEDs on a first semiconductor chip, the first semiconductor chip electrically coupled to a substrate;
   a plurality of first photodetectors part of a second semiconductor chip, the second semi-conductor chip electrically coupled to the substrate;
   a plurality of waveguides, each of the plurality of waveguides coupling different ones of the plurality of first microLEDs with different ones of the plurality of first photodetectors;
   a plurality of second microLEDs on the second semiconductor chip;
   a plurality of second photodetectors part of the first semiconductor chip; and
   a further plurality of waveguides, each of the further plurality of waveguides coupling different ones of the plurality of second microLEDs with different ones of the plurality of second photodetectors;
   wherein the first semiconductor chip includes first drive circuitry for driving the plurality of first microLEDs and first receive circuitry for processing signals generated by the plurality of second photodetectors, and the second semiconductor chip includes second drive circuitry for driving the plurality of second microLEDs and second receive circuitry for processing signals generated by the plurality of first photodetectors; and
   further comprising a semiconductor package;
   wherein the plurality of first microLEDs and the first semiconductor chip are in the semiconductor package; and
   wherein the plurality of first photodetectors and the second semiconductor chip are in the semiconductor package.

2. The optical communication system of claim 1, wherein the first semiconductor chip comprises a first transceiver die and the second semiconductor chip comprises a second transceiver die, and further comprising:
   a third semiconductor chip electrically coupled to the first transceiver die; and
   a fourth semiconductor chip electrically coupled to the second transceiver die.

* * * * *